US008872329B1

(12) United States Patent
Hiner et al.

(10) Patent No.: US 8,872,329 B1
(45) Date of Patent: Oct. 28, 2014

(54) EXTENDED LANDING PAD SUBSTRATE PACKAGE STRUCTURE AND METHOD

(75) Inventors: David Jon Hiner, Chandler, AZ (US); Ronald Patrick Huemoeller, Gilbert, AZ (US)

(73) Assignee: Amkor Technology, Inc.

( * ) Notice: Subject to any disclaimer, the term of this patent is extended or adjusted under 35 U.S.C. 154(b) by 647 days.

(21) Appl. No.: 12/351,596

(22) Filed: Jan. 9, 2009

(51) Int. Cl.
*H01L 23/12* (2006.01)

(52) U.S. Cl.
USPC .................... 257/700; 257/698; 257/E23.011

(58) Field of Classification Search
CPC .................................................. H01L 23/3128
USPC .................................. 257/700, E23.011, 698
See application file for complete search history.

(56) References Cited

U.S. PATENT DOCUMENTS

| 3,324,014 | A | 6/1967 | Modjeska |
| 3,778,900 | A | 12/1973 | Haining et al. |
| 3,868,724 | A | 2/1975 | Perrino |
| 3,916,434 | A | 10/1975 | Garboushian |
| 4,322,778 | A | 3/1982 | Barbour et al. |
| 4,508,754 | A | 4/1985 | Stepan |
| 4,532,152 | A | 7/1985 | Elarde |
| 4,532,419 | A | 7/1985 | Takeda |
| 4,604,799 | A | 8/1986 | Gurol |
| 4,642,160 | A | 2/1987 | Burgess |
| 4,685,033 | A | 8/1987 | Inoue |
| 4,706,167 | A | 11/1987 | Sullivan |
| 4,716,049 | A | 12/1987 | Patraw |
| 4,786,952 | A | 11/1988 | MacIver et al. |
| 4,806,188 | A | 2/1989 | Rellick |
| 4,811,082 | A | 3/1989 | Jacobs et al. |
| 4,897,338 | A | 1/1990 | Spicciati et al. |
| 4,905,124 | A | 2/1990 | Banjo et al. |
| 4,915,983 | A | 4/1990 | Lake et al. |
| 4,964,212 | A | 10/1990 | Deroux-Dauphin et al. |
| 4,974,120 | A | 11/1990 | Kodai et al. |

(Continued)

FOREIGN PATENT DOCUMENTS

| JP | 05-109975 | 4/1993 |
| JP | 05-136323 | 6/1993 |

(Continued)

OTHER PUBLICATIONS

"Microstructure Solder Mask by Means of a Laser", *IBM Technical Disclosure Bulletin*, Nov. 1, 1993, p. 589, vol. 36—Issue 11, (NN9311589).

(Continued)

*Primary Examiner* — Hsin-Yi Hsieh
(74) *Attorney, Agent, or Firm* — McAndrews, Held & Malloy, Ltd.

(57) ABSTRACT

An extended landing pad substrate package includes a dielectric layer having an upper surface and an opposite lower surface. A lower circuit pattern is embedded in the lower surface of the dielectric layer. The lower circuit pattern includes traces having a first thickness and extended landing pads having a second thickness greater than the first thickness. Blind via apertures are formed through an upper circuit pattern embedded into the upper surface of the dielectric layer, through the dielectric layer and to the extended landing pads. The length of the blind via apertures is minimized due to the increase second thickness of the extended landing pads as compared to the first thickness of traces. Accordingly, the width of the blind via apertures at the upper surface of the dielectric layer is minimized.

14 Claims, 8 Drawing Sheets

(56) References Cited

U.S. PATENT DOCUMENTS

| | | | |
|---|---|---|---|
| 4,996,391 A | 2/1991 | Schmidt | |
| 5,021,047 A | 6/1991 | Movern | |
| 5,053,357 A | 10/1991 | Lin et al. | |
| 5,072,075 A | 12/1991 | Lee et al. | |
| 5,081,520 A | 1/1992 | Yoshii et al. | |
| 5,108,553 A | 4/1992 | Foster et al. | |
| 5,110,664 A | 5/1992 | Nakanishi et al. | |
| 5,191,174 A | 3/1993 | Chang et al. | |
| 5,229,550 A | 7/1993 | Bindra et al. | |
| 5,239,448 A | 8/1993 | Perkins et al. | |
| 5,247,429 A | 9/1993 | Iwase et al. | |
| 5,263,243 A | 11/1993 | Taneda et al. | |
| 5,283,459 A | 2/1994 | Hirano et al. | |
| 5,293,243 A | 3/1994 | Degnan et al. | |
| 5,371,654 A | 12/1994 | Beaman et al. | |
| 5,379,191 A | 1/1995 | Carey et al. | |
| 5,404,044 A | 4/1995 | Booth et al. | |
| 5,440,805 A | 8/1995 | Daigle et al. | |
| 5,463,253 A | 10/1995 | Waki et al. | |
| 5,474,957 A | 12/1995 | Urushima | |
| 5,474,958 A | 12/1995 | Djennas et al. | |
| 5,508,938 A | 4/1996 | Wheeler | |
| 5,530,288 A | 6/1996 | Stone | |
| 5,531,020 A | 7/1996 | Durand et al. | |
| 5,574,309 A | 11/1996 | Papapietro et al. | |
| 5,581,498 A | 12/1996 | Ludwig et al. | |
| 5,582,858 A | 12/1996 | Adamopoulos et al. | |
| 5,616,422 A | 4/1997 | Ballard et al. | |
| 5,637,832 A | 6/1997 | Danner | |
| 5,674,785 A | 10/1997 | Akram et al. | |
| 5,719,749 A | 2/1998 | Stopperan | |
| 5,739,579 A | 4/1998 | Chiang et al. | |
| 5,739,581 A | 4/1998 | Chillara | |
| 5,739,585 A | 4/1998 | Akram et al. | |
| 5,739,588 A | 4/1998 | Ishida et al. | |
| 5,742,479 A | 4/1998 | Asakura | |
| 5,774,340 A | 6/1998 | Chang et al. | |
| 5,784,259 A | 7/1998 | Asakura | |
| 5,798,014 A | 8/1998 | Weber | |
| 5,822,190 A | 10/1998 | Iwasaki | |
| 5,826,330 A | 10/1998 | Isoda et al. | |
| 5,835,355 A | 11/1998 | Dordi | |
| 5,847,453 A | 12/1998 | Uematsu et al. | |
| 5,894,108 A | 4/1999 | Mostafazadeh et al. | |
| 5,903,052 A | 5/1999 | Chen et al. | |
| 5,936,843 A | 8/1999 | Ohshima et al. | |
| 5,952,611 A | 9/1999 | Eng et al. | |
| 5,990,546 A | 11/1999 | Igarashi et al. | |
| 6,004,619 A | 12/1999 | Dippon et al. | |
| 6,013,948 A | 1/2000 | Akram et al. | |
| 6,021,564 A | 2/2000 | Hanson | |
| 6,028,364 A | 2/2000 | Ogino et al. | |
| 6,034,427 A | 3/2000 | Lan et al. | |
| 6,035,527 A | 3/2000 | Tamm | |
| 6,039,889 A | 3/2000 | Zhang et al. | |
| 6,040,622 A | 3/2000 | Wallace | |
| 6,060,778 A | 5/2000 | Jeong et al. | |
| 6,069,407 A | 5/2000 | Hamzehdoost | |
| 6,072,243 A | 6/2000 | Nakanishi | |
| 6,081,036 A | 6/2000 | Hirano et al. | |
| 6,115,910 A | 9/2000 | Ghahghahi | |
| 6,119,338 A | 9/2000 | Wang et al. | |
| 6,122,171 A | 9/2000 | Akram et al. | |
| 6,127,250 A | 10/2000 | Sylvester et al. | |
| 6,127,833 A | 10/2000 | Wu et al. | |
| 6,160,705 A | 12/2000 | Stearns et al. | |
| 6,162,365 A | 12/2000 | Bhatt et al. | |
| 6,172,419 B1 | 1/2001 | Kinsman | |
| 6,175,087 B1 | 1/2001 | Keesler et al. | |
| 6,184,463 B1 | 2/2001 | Panchou et al. | |
| 6,194,250 B1 | 2/2001 | Melton et al. | |
| 6,204,453 B1 | 3/2001 | Fallon et al. | |
| 6,214,641 B1 | 4/2001 | Akram | |
| 6,235,554 B1 | 5/2001 | Akram et al. | |
| 6,239,485 B1 | 5/2001 | Peters et al. | |
| D445,096 S | 7/2001 | Wallace | |
| D446,525 S | 8/2001 | Okamoto et al. | |
| 6,274,821 B1 | 8/2001 | Echigo et al. | |
| 6,280,641 B1 | 8/2001 | Gaku et al. | |
| 6,316,285 B1 | 11/2001 | Jiang et al. | |
| 6,351,031 B1 | 2/2002 | Iijima et al. | |
| 6,352,914 B2 | 3/2002 | Ball et al. | |
| 6,353,999 B1 | 3/2002 | Cheng | |
| 6,365,975 B1 | 4/2002 | DiStefano et al. | |
| 6,368,967 B1 | 4/2002 | Besser | |
| 6,376,906 B1 | 4/2002 | Asai et al. | |
| 6,378,201 B1 | 4/2002 | Tsukada et al. | |
| 6,392,160 B1 | 5/2002 | Andry et al. | |
| 6,395,578 B1 | 5/2002 | Shin et al. | |
| 6,405,431 B1 | 6/2002 | Shin et al. | |
| 6,406,942 B2 | 6/2002 | Honda | |
| 6,407,341 B1 | 6/2002 | Anstrom et al. | |
| 6,407,930 B1 | 6/2002 | Hsu | |
| 6,418,615 B1 | 7/2002 | Rokugawa et al. | |
| 6,426,550 B2 | 7/2002 | Ball et al. | |
| 6,451,509 B2 | 9/2002 | Keesler et al. | |
| 6,472,306 B1 | 10/2002 | Lee et al. | |
| 6,479,762 B2 | 11/2002 | Kusaka | |
| 6,497,943 B1 * | 12/2002 | Jimarez et al. | 428/209 |
| 6,502,774 B1 | 1/2003 | Johansson et al. | |
| 6,517,995 B1 | 2/2003 | Jacobson et al. | |
| 6,528,874 B1 * | 3/2003 | Iijima et al. | 257/700 |
| 6,534,391 B1 | 3/2003 | Huemoeller et al. | |
| 6,534,723 B1 | 3/2003 | Asai et al. | |
| 6,544,638 B2 | 4/2003 | Fischer et al. | |
| 6,570,258 B2 | 5/2003 | Ma et al. | |
| 6,574,106 B2 | 6/2003 | Mori | |
| 6,586,682 B2 | 7/2003 | Strandberg | |
| 6,608,757 B1 | 8/2003 | Bhatt et al. | |
| 6,637,105 B1 | 10/2003 | Watanabe et al. | |
| 6,660,559 B1 | 12/2003 | Huemoeller et al. | |
| 6,715,204 B1 | 4/2004 | Tsukada et al. | |
| 6,727,645 B2 | 4/2004 | Tsujimura et al. | |
| 6,730,857 B2 | 5/2004 | Konrad et al. | |
| 6,740,964 B2 | 5/2004 | Sasaki | |
| 6,753,612 B2 | 6/2004 | Adae-Amoakoh et al. | |
| 6,787,443 B1 | 9/2004 | Boggs et al. | |
| 6,803,528 B1 | 10/2004 | Koyanagi | |
| 6,804,881 B1 | 10/2004 | Shipley et al. | |
| 6,815,709 B2 | 11/2004 | Clothier et al. | |
| 6,815,739 B2 | 11/2004 | Huff et al. | |
| 6,822,334 B2 | 11/2004 | Hori et al. | |
| 6,891,261 B2 | 5/2005 | Awaya | |
| 6,908,863 B2 | 6/2005 | Barns et al. | |
| 6,913,952 B2 | 7/2005 | Moxham et al. | |
| 6,919,514 B2 | 7/2005 | Konrad et al. | |
| 6,930,256 B1 | 8/2005 | Huemoeller et al. | |
| 6,930,257 B1 | 8/2005 | Hiner et al. | |
| 6,940,170 B2 | 9/2005 | Parikh | |
| 6,989,593 B2 | 1/2006 | Khan et al. | |
| 6,998,335 B2 | 2/2006 | Fan et al. | |
| 7,028,400 B1 | 4/2006 | Hiner et al. | |
| 7,033,928 B2 | 4/2006 | Kawano | |
| 7,061,095 B2 | 6/2006 | Boggs et al. | |
| 7,145,238 B1 | 12/2006 | Huemoeller et al. | |
| 7,214,609 B2 | 5/2007 | Jiang et al. | |
| 7,242,081 B1 | 7/2007 | Lee | |
| 7,292,056 B2 | 11/2007 | Matsuda | |
| 7,297,562 B1 | 11/2007 | Huemoeller et al. | |
| 7,345,361 B2 | 3/2008 | Mallik et al. | |
| 7,365,006 B1 | 4/2008 | Huemoeller et al. | |
| 7,372,151 B1 | 5/2008 | Fan et al. | |
| 7,399,661 B2 | 7/2008 | Hiner et al. | |
| 7,435,352 B2 | 10/2008 | Mok et al. | |
| 2001/0041436 A1 | 11/2001 | Parikh | |
| 2002/0017712 A1 | 2/2002 | Bessho et al. | |
| 2002/0140105 A1 | 10/2002 | Higgins, III et al. | |
| 2003/0000738 A1 | 1/2003 | Rumsey et al. | |
| 2003/0128096 A1 | 7/2003 | Mazzochette | |
| 2005/0194353 A1 | 9/2005 | Johnson et al. | |
| 2005/0205295 A1 | 9/2005 | Tsuk | |
| 2006/0157854 A1 | 7/2006 | Takewaki et al. | |
| 2006/0197228 A1 | 9/2006 | Daubenspeck et al. | |
| 2007/0114203 A1 | 5/2007 | Kang | |

(56) References Cited

U.S. PATENT DOCUMENTS

| | | |
|---|---|---|
| 2007/0273049 A1 | 11/2007 | Khan et al. |
| 2007/0290376 A1 | 12/2007 | Zhao et al. |
| 2008/0230887 A1 | 9/2008 | Sun et al. |

FOREIGN PATENT DOCUMENTS

| | | |
|---|---|---|
| JP | 07-017175 | 1/1995 |
| JP | 08-190615 | 7/1996 |
| JP | 10-334205 | 12/1998 |

OTHER PUBLICATIONS

Wolf et al., "Silicon Processing for the VLSI Era: vol. 1—Process Technology", 1986, pp. 407-408.

Scanlan, "Package-on-package (PoP) with Through-mold Vias", *Advanced Packaging*, Jan. 2008, 3 pages, vol. 17, Issue 1, PennWell Corporation.

Kim et al., "Application of Through Mold Via (TMV) as PoP base package", *58th ECTC Proceedings*, May 2008, Lake Buena Vista, FL, 6 pages, IEEE.

\* cited by examiner

US 8,872,329 B1

EXTENDED LANDING PAD SUBSTRATE PACKAGE STRUCTURE AND METHOD

BACKGROUND OF THE INVENTION

1. Field of the Invention

The present application relates to the field of electronics, and more particularly, to methods of forming electronic component packages and related structures.

2. Description of the Related Art

During fabrication of an electronic component package substrate, an upper circuit pattern is formed on or embedded within an upper surface of a dielectric layer. Similarly, a lower circuit pattern is formed on or embedded within a lower surface of the dielectric layer.

To electrically interconnect the upper circuit pattern with the lower circuit pattern through the dielectric layer, blind via apertures are formed through the upper circuit pattern and the dielectric layer to expose portions of the lower circuit pattern. The blind via apertures are filled with electrically conductive material to form blind vias electrically interconnecting the upper circuit pattern with the lower circuit pattern.

The blind via apertures are formed using laser-ablation, i.e., by using a laser to ablate through the upper circuit pattern and the dielectric layer to form the blind via apertures. Accordingly, the blind via apertures taper, i.e., are not perfectly cylindrical.

More particularly, the blind via apertures have a greater width at the upper circuit pattern than at the lower circuit pattern. The relatively large width of the blind via apertures at the upper circuit pattern places fundamental restrictions on the ability to minimize the feature size of the substrate.

SUMMARY OF THE INVENTION

In accordance with one embodiment, an extended landing pad substrate package includes a dielectric layer having an upper surface and an opposite lower surface. A lower circuit pattern is embedded in the lower surface of the dielectric layer. The lower circuit pattern includes traces having a first thickness and extended landing pads having a second thickness greater than the first thickness.

Blind via apertures are formed through an upper circuit pattern embedded into the upper surface of the dielectric layer, through the dielectric layer and to the extended landing pads. The length of the blind via apertures is minimized due to the increased second thickness of the extended landing pads as compared to the first thickness of traces. Accordingly, the width of the blind via apertures at the upper surface of the dielectric layer is minimized. Accordingly, extremely small blind via apertures are formed even when the dielectric layer is relatively thick. This enables the upper circuit pattern to be formed with minimum feature size.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 15:
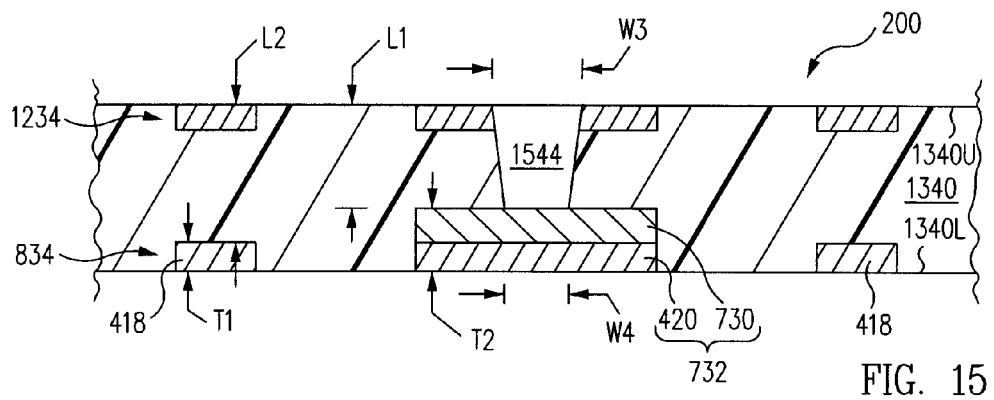

As an overview, referring to FIG. 15, an extended landing pad substrate package 200 includes a dielectric layer 1340 having an upper surface 1340U and an opposite lower surface 1340L. A lower circuit pattern 834 is embedded in lower surface 1340L of dielectric layer 1340. Lower circuit pattern 834 includes traces 418 having a first thickness T1 and extended landing pads 732 having a second thickness T2 greater than first thickness T1.

Blind via apertures 1544 are formed through an upper circuit pattern 1234 embedded into upper surface 1340U of dielectric layer 1340, through dielectric layer 1340 and to extended landing pads 732. The length L1 of blind via apertures 1544 is minimized due to the increased thickness T2 of extended landing pads 732 as compared to thickness T1 of traces 418. Accordingly, the width W3 of blind via apertures 1544 at upper surface 1340U of dielectric layer 1340 is minimized. Accordingly, extremely small blind via apertures 1544 are formed even when dielectric layer 1340 is relatively thick. This enables upper circuit pattern 1234 to be formed with minimum feature size.

In one embodiment, by minimizing length L1 of blind via apertures 1544, tolerance in the alignment between blind via apertures 1544 and extended landing pads 732 is minimized. This enables the width of extended landing pads 732 in a direction parallel to lower surface 1340L of dielectric layer 1340 to be minimized. This, in turn, enables lower circuit pattern 834 to be formed with minimum feature size.

In one embodiment, by minimizing length L1 of blind via apertures 1544, the time required to form blind via apertures 1544 is minimized thus minimizing the cost of the blind via laser-ablation process and thus of extended landing pad substrate package 200.

Figure 1:
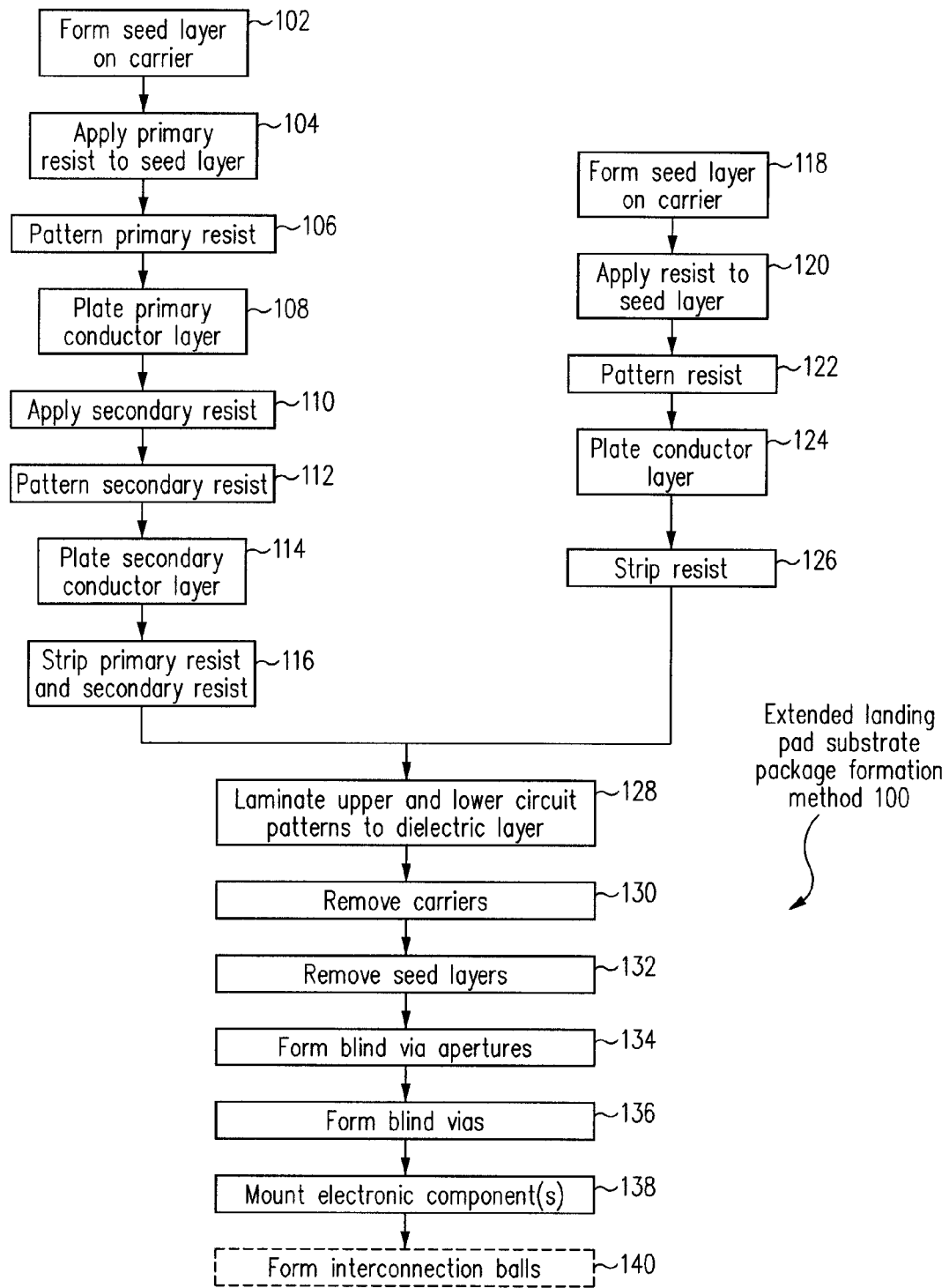
FIG. 1 is an extended landing pad substrate package formation method in accordance with one embodiment.
Figure 2:
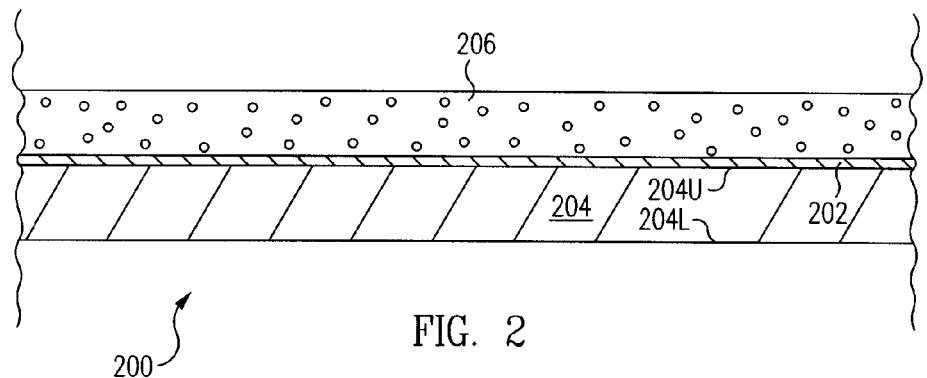
FIG. 2 is a cross-sectional view of an extended landing pad substrate package during fabrication in accordance with one embodiment.

More particularly, FIG. 1 is an extended landing pad substrate package formation method 100 in accordance with one embodiment. FIG. 2 is a cross-sectional view of an extended landing pad substrate package 200 during fabrication in accordance with one embodiment. Referring now to FIGS. 1 and 2 together, in a form seed layer on carrier operation 102, a seed layer 202 is formed on a carrier 204.

Carrier 204 is an electrically conductive material, e.g., copper, although is formed of other conductive materials in other embodiments. In yet another embodiment, carrier 204 is a dielectric material.

Carrier 204 includes a first surface 204U and an opposite second surface 204L. Seed layer 202 is formed, e.g., by plating a conductive material or applying a conductive foil, on first surface 204U of carrier 204. As illustrated in FIG. 2, seed layer 202 entirely covers upper surface 204U of carrier 204. Seed layer 202 is an electrically conductive material, e.g., copper.

From form seed layer on carrier operation 102, flow moves to an apply primary resist to seed layer operation 104. In apply primary resist to seed layer operation 104, a primary resist 206 is applied to seed layer 202. As illustrated in FIG. 2, primary resist 206 entirely covers seed layer 202. Primary resist 206, e.g., photoresist, is a dielectric material.

Figure 3:
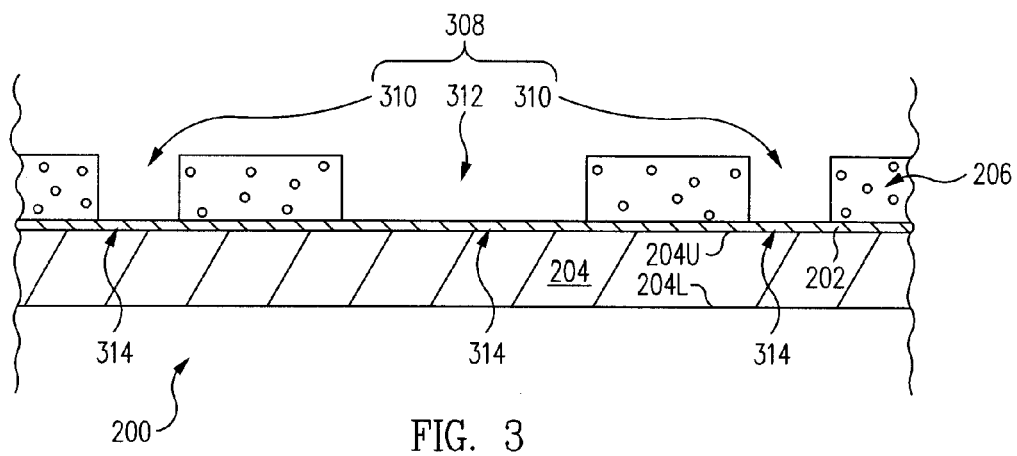
FIGS. 3, 4, 5, 6, 7, 8 are cross-sectional views of the extended landing pad substrate package of FIG. 2 at later stages during fabrication in accordance with various embodiments.

FIG. 3 is a cross-sectional view of extended landing pad substrate package 200 of FIG. 2 at a later stage during fabrication in accordance with one embodiment. Referring now to FIGS. 1 and 3 together, from apply primary resist to seed layer operation 104, flow moves to a pattern primary resist operation 106. In pattern primary resist operation 106, primary resist 206 is patterned to form a circuit pattern artifact 308 within primary resist 206.

Circuit pattern artifact 308, i.e., a patterned opening within primary resist 206, is a positive image of the circuit pattern to be formed. More particularly, primary resist 206 is patterned to expose exposed portions 314 of seed layer 202 through circuit pattern artifact 308. Primary resist 206 is patterned using any one of a number of resist patterning techniques such as laser-ablation or photo-imaging, and the particular technique used is not essential to this embodiment.

Circuit pattern artifact 308 includes a trace pattern artifact 310 and an extended landing pad pattern artifact 312. Trace pattern artifact 310, i.e., a first portion of the patterned opening within primary resist 206, is a positive image of the traces of the circuit pattern to be formed. Extended landing pad pattern artifact 312, i.e., a second portion of the patterned opening within primary resist 206, is a positive image of the extended landing pads of the circuit pattern to be formed.

Figure 4:
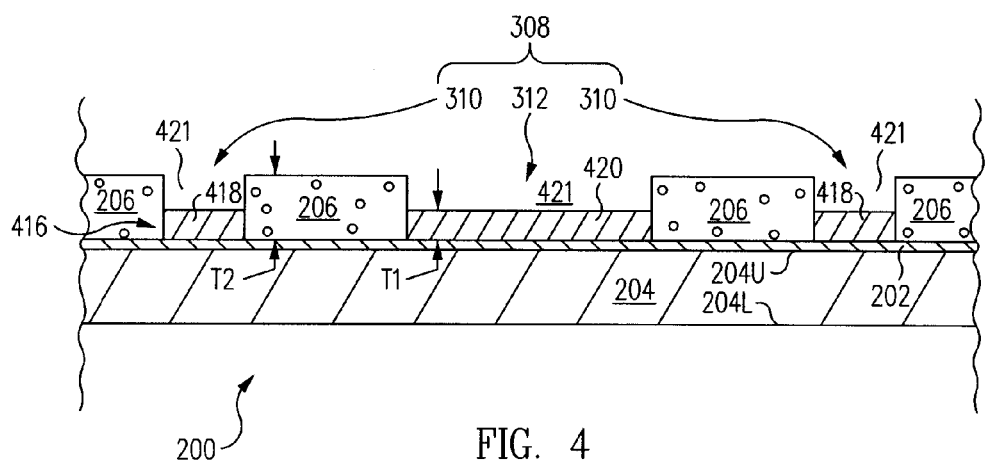

FIG. 4 is a cross-sectional view of extended landing pad substrate package 200 of FIG. 3 at a later stage during fabrication in accordance with one embodiment. Referring now to FIGS. 1, 3 and 4 together, from pattern primary resist operation 106, flow moves to a plate primary conductor layer operation 108. In plate primary conductor layer operation 108, a primary conductor layer 416 is plated within circuit pattern artifact 308 of primary resist 206. Primary conductor layer 416 is formed of an electrically conductive material such as copper, sometimes called a circuit pattern metal.

Primary conductor layer 416 is plated on seed layer 202 using primary resist 206 as a mask. More particularly, primary conductor layer 416 is plated on exposed portions 314 of seed layer 202, e.g., using seed layer 202 as the electroplating electrode.

Illustratively, primary conductor layer 416 includes electrically conductive traces 418 and extended landing pad foundation portions 420. More particularly, traces 418 are formed within trace pattern artifact 310 of circuit pattern artifact 308. Extended landing pad foundation portions 420 are formed within extending landing pad pattern artifact 312 of circuit pattern artifact 308.

For simplicity of presentation, only two traces 418 and a single extended landing pad foundation portion 420 are illustrated in the figures. However, in light of this disclosure, those of skill in the art will understand that a plurality of traces 418 and extended landing pad foundation portions 420 and the associated structures as discussed below are formed.

In accordance with this embodiment, primary conductor layer 416 only partially fills circuit pattern artifact 308. More particularly, the thickness T1 of primary conductor layer 416 is less than the thickness T2 of primary resist 206. Accordingly, an unfilled portion 421 of circuit pattern artifact 308 remains empty.

Figure 5:
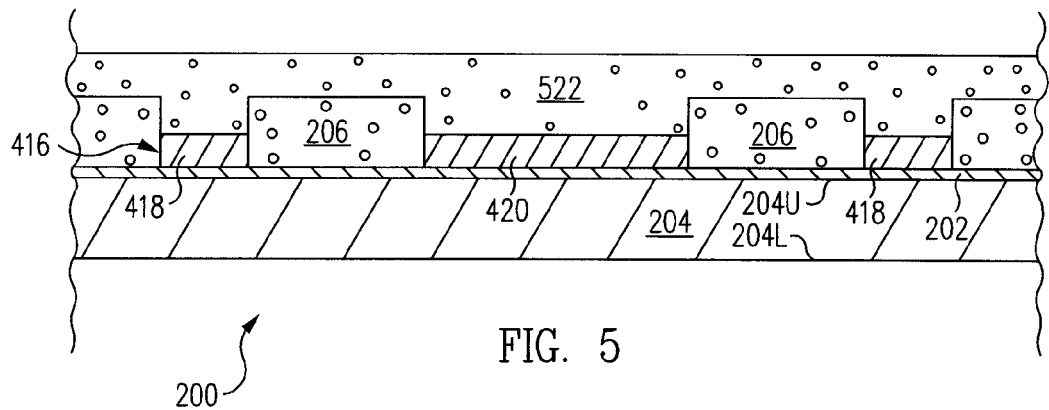

FIG. 5 is a cross-sectional view of extended landing pad substrate package 200 of FIG. 4 at a later stage during fabrication in accordance with one embodiment. Referring now to FIGS. 1, 4 and 5 together, from plate primary conductor layer operation 108, flow moves to an apply secondary resist operation 110. In apply secondary resist operation 110, a secondary resist 522, e.g., photoresist, is applied to entirely cover primary resist 206 and primary conductor layer 416 as illustrated in FIG. 5. Secondary resist 522 fills unfilled portion 421 of circuit pattern artifact 308. In one embodiment, secondary resist 522 is a dielectric material.

Figure 6:
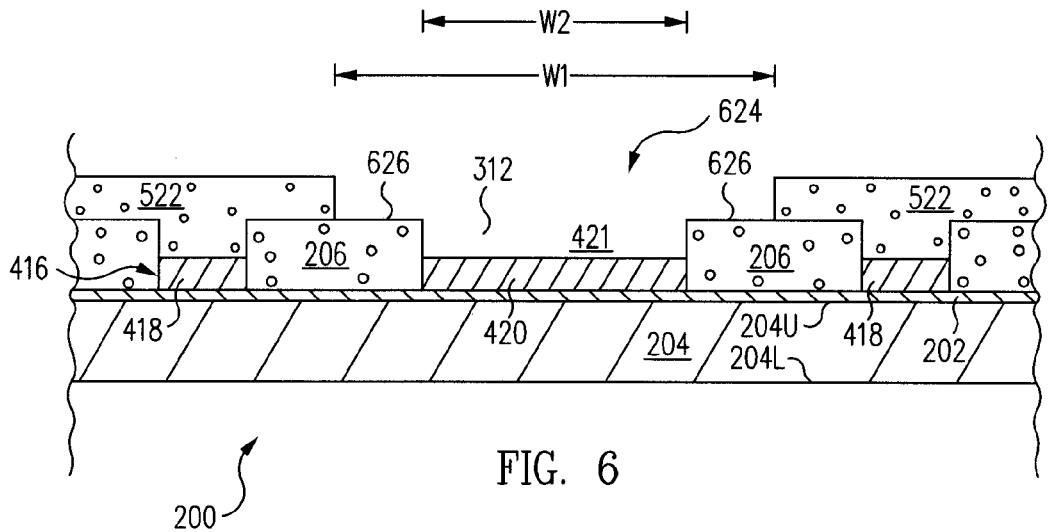

FIG. 6 is a cross-sectional view of extended landing pad substrate package 200 of FIG. 5 at a later stage during fabrication in accordance with one embodiment. Referring now to FIGS. 1 and 6 together, from apply secondary resist operation 110, flow moves to a pattern secondary resist operation 112. In pattern secondary resist operation 112, secondary resist 522 is patterned to form an extended landing pad overlay pattern artifact 624 within secondary resist 522.

Extended landing pad overlay pattern artifact 624, i.e., a patterned opening within secondary resist 522, is a positive image of the extended landing pads to be formed. More particularly, secondary resist 522 is patterned to expose extended landing pad foundation portions 420 of primary conductor layer 416 through extended landing pad overlay pattern artifact 624. Secondary resist 522 is patterned using any one of a number of resist patterning techniques such as laser-ablation or photo-imaging, and the particular technique used is not essential to this embodiment.

In one embodiment, to accommodate for tolerance between the patterning of primary resist 206 and secondary resist 522, extended landing pad overlay pattern artifact 624 is formed with a greater width W1 then the width W2 of extended landing pad pattern artifact 312 (and thus extending landing pad foundation portions 420). Accordingly, portions 626 of primary resist 206 adjacent extended landing pad pattern artifact 312 (and extending landing pad foundation portions 420) are exposed.

Secondary resist 522 remains over traces 418 of primary conductor layer 416 thus protecting traces 418 from additive plating as discussed below.

Figure 7:
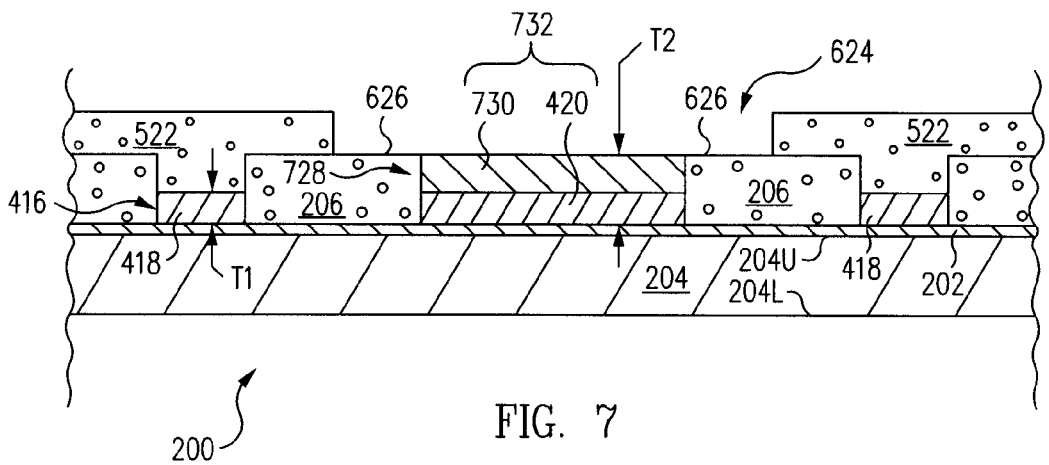

FIG. 7 is a cross-sectional view of extended landing pad substrate package 200 of FIG. 6 at a later stage during fabrication in accordance with one embodiment. Referring now to FIGS. 1, 6 and 7 together, from pattern secondary resist operation 112, flow moves to a plate secondary conductor layer operation 114. In plate secondary conductor layer operation 114, a secondary conductor layer 728 is plated on primary conductor layer 416 using primary resist 206 and secondary resist 522 as a mask.

More particularly, secondary conductor layer 728 is plated on extended landing pad foundation portions 420 of primary conductor layer 416, e.g., using primary conductor layer 416 as the electroplating electrode.

Secondary conductor layer 728 is plated within extending landing pad pattern artifact 312 of primary resist 206 through extended landing pad overlay pattern artifact 624 of secondary resist 522. Secondary conductor layer 728 is formed of an electrically conductive material such as copper, sometimes called an extended landing pad extension metal.

In accordance with this embodiment, secondary conductor layer 728 completely fills unfilled portion 421 of extending landing pad pattern artifact 312. In one embodiment, secondary conductor layer 728 is over plated to cover portions 626 of primary resist 206 and then etched to expose portions 626 of primary resist 206 to ensure that unfilled portion 421 of extending landing pad pattern artifact 312 is completely filled. Secondary resist 522 covers and protects traces 418 and thus secondary conductor layer 728 is not formed on traces 418.

Secondary conductor layer 728 forms extended landing pad extension portions 730. As set forth above, extended landing pad extension portions 730 are selectively plated on extended landing pad foundation portions 420. Collectively, extended landing pad foundation portions 420 and extended landing pad extension portions 730 form extended landing pads 732.

Extended landing pads 732 have thickness T2 of primary resist 206. Accordingly, by selecting the desired thickness T2 of primary resist 206, the thickness T2 of extended landing pads 732 is precisely controlled. Recall that traces 418 have thickness T1 less than thickness T2 of extended landing pads 732.

Figure 8:
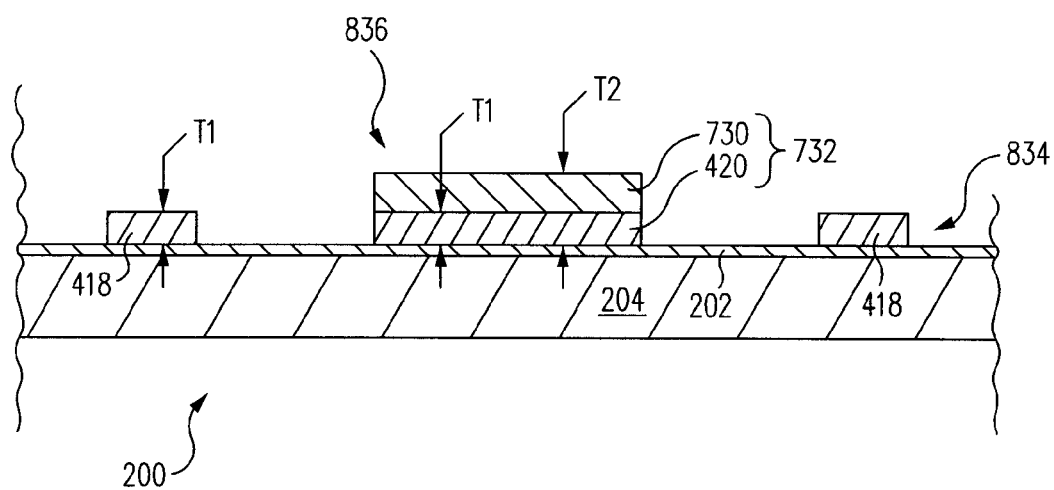

FIG. 8 is a cross-sectional view of extended landing pad substrate package 200 of FIG. 7 at a later stage during fabrication in accordance with one embodiment. Referring now to FIGS. 1, 7 and 8 together, from plate secondary conductor layer operation 114, flow moves to a strip primary resist and secondary resist operation 116. In strip primary resist and secondary resist operation 116, primary resist 206 and secondary resist 522 are stripped, i.e., removed. Primary resist 206 and secondary resist 522 are stripped using any one of a number of techniques and the particular technique used is not essential to this embodiment.

Paying particular attention now to FIGS. 1 and 8 together, after performance of strip primary resist and secondary resist operation 116, a lower, e.g., first, circuit pattern 834 remains upon seed layer 202 and generally on carrier 204. Lower circuit pattern 834 includes traces 418 and extended landing pads 732. Traces 418 are electrical conductors extending in the horizontal, e.g., first, direction substantially parallel to first surface 204U of carrier 204. Extended landing pads 732 are electrically interconnected to traces 418.

As discussed above, traces 418 have thickness T1 less than thickness T2 of extended landing pads 732. More particularly, thickness T1 and thickness T2 are measured in the vertical, e.g., second, direction substantially perpendicular to first surface 204U of carrier 204.

Extended landing pad substrate package 200 at the stage illustrated in FIG. 8 is sometimes referred to as a lower, e.g., first, circuit pattern carrier structure 836. More particularly, lower circuit pattern carrier structure 836, sometimes called a second layer transfer template, includes carrier 204, seed layer 202, and lower circuit pattern 834.

As discussed below with reference to operations 118, 120, 122, 124, 126 and FIGS. 1, 9, 10, 11, 12, an upper circuit pattern carrier structure is also formed separately from lower circuit pattern carrier structure 836.

Figure 9:
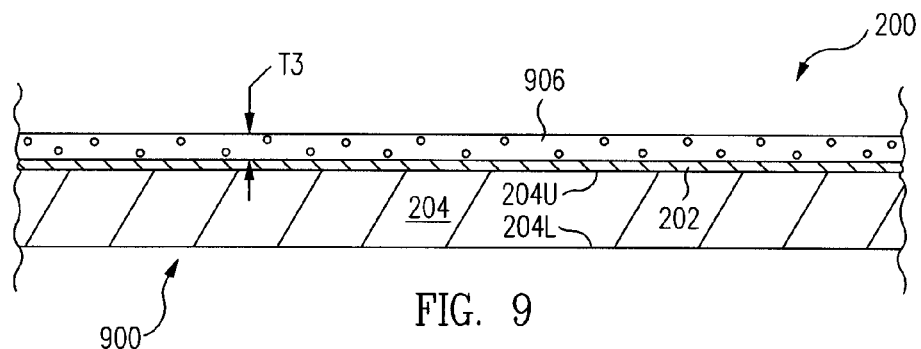
FIG. 9 is a cross-sectional view of an upper circuit pattern carrier structure of the extended landing pad substrate package in accordance with one embodiment.

FIG. 9 is a cross-sectional view of an upper, e.g., second, circuit pattern carrier structure 900 of extended landing pad substrate package 200 in accordance with one embodiment. Referring now to FIGS. 1 and 9 together, in a form seed layer on carrier operation 118, a seed layer 202 is formed on a carrier 204. Seed layer 202 and carrier 204 are similar to seed layer 202 and carrier 204 as discussed above in reference to FIG. 2 and so the description thereof is not repeated here.

From form seed layer on carrier operation 118, flow moves to an apply resist to seed layer operation 120. In apply resist to seed layer operation 120, a resist 906 is applied to seed layer 202. As illustrated in FIG. 9, resist 906 entirely covers seed layer 202. Resist 906, e.g., photoresist, is a dielectric material. In one embodiment, thickness T2 of primary resist 206 (see FIG. 4) is greater than a thickness T3 of resist 906, e.g., primary resist 206 is two to three times thicker than resist 906.

Figure 10:
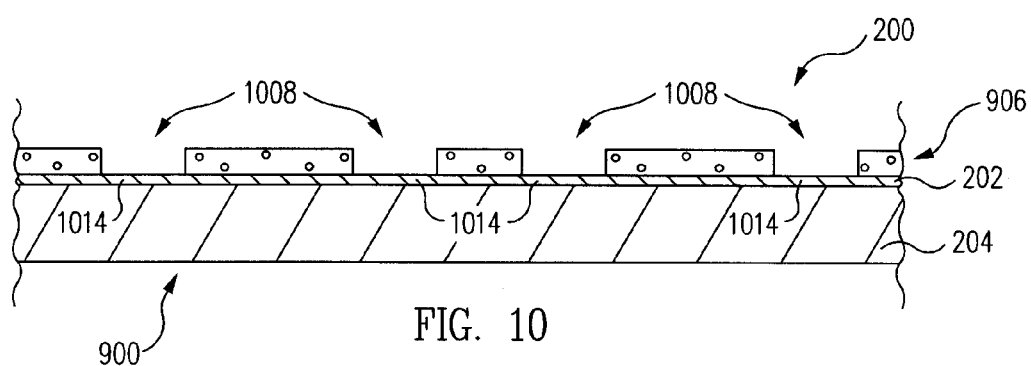
FIGS. 10, 11, 12 are cross-sectional view of the upper circuit pattern carrier structure of the extended landing pad substrate package of FIG. 9 at later stages during fabrication in accordance with various embodiments.

FIG. 10 is a cross-sectional view of upper circuit pattern carrier structure 900 of extended landing pad substrate package 200 of FIG. 9 at a later stage during fabrication in accordance with one embodiment. Referring now to FIGS. 1 and 10 together, from apply resist to seed layer operation 120, flow moves to a pattern resist operation 122. In pattern resist operation 122, resist 906 is patterned to form a circuit pattern artifact 1008 within resist 906.

Circuit pattern artifact 1008, i.e., a patterned opening within resist 906, is a positive image of the circuit pattern to be formed. More particularly, resist 906 is patterned to expose exposed portions 1014 of seed layer 202 through circuit pattern artifact 1008. Resist 906 is patterned using any one of a number of resist patterning techniques such as laser-ablation or photo-imaging, and the particular technique used is not essential to this embodiment.

Figure 11:
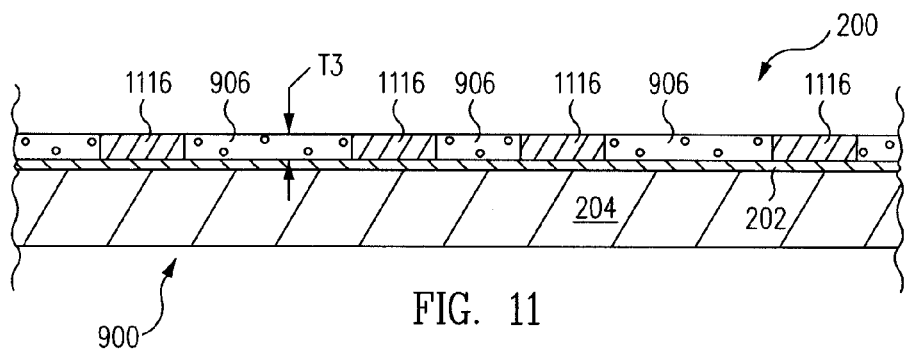

FIG. 11 is a cross-sectional view of upper circuit pattern carrier structure 900 of extended landing pad substrate package 200 of FIG. 10 at a later stage during fabrication in accordance with one embodiment. Referring now to FIGS. 1, 10 and 11 together, from pattern resist operation 122, flow moves to a plate conductor layer operation 124. In plate conductor layer operation 124, a conductor layer 1116 is plated within circuit pattern artifact 1008 of resist 906. Conductor layer 1116 is formed of an electrically conductive material such as copper, sometimes called a circuit pattern metal.

Conductor layer 1116 is plated on seed layer 202 using resist 906 as a mask. More particularly, conductor layer 1116 is plated on exposed portions 1014 of seed layer 202, e.g., using seed layer 202 as the electroplating electrode. In accordance with this embodiment, conductor layer 1116 completely fills circuit pattern artifact 1008. More particularly, conductor layer 1116 and resist 906 have an approximately equal thickness T3.

Figure 12:
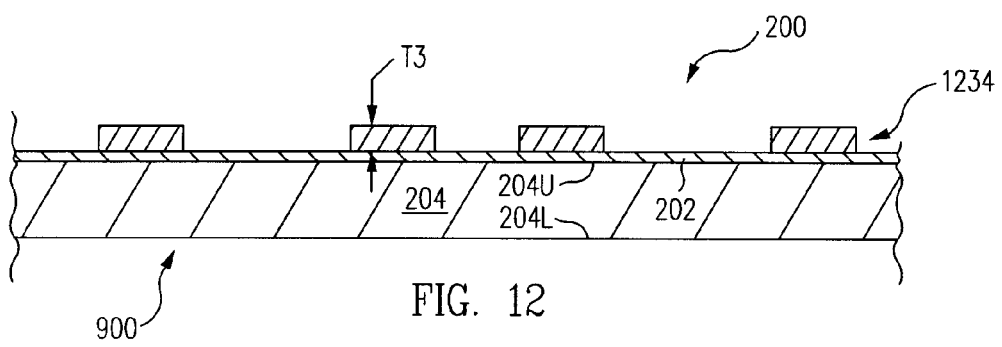

FIG. 12 is a cross-sectional view of upper circuit pattern carrier structure 900 of extended landing pad substrate package 200 of FIG. 11 at a later stage during fabrication in accordance with one embodiment. Referring now to FIGS. 1, 11 and 12 together, from plate conductor layer operation 124, flow moves to a strip resist operation 126. In strip resist operation 126, resist 906 is stripped, i.e., removed. Resist 906 is stripped using any one of a number of techniques and the particular technique used is not essential to this embodiment. At the stage illustrated in FIG. 12, fabrication of upper circuit pattern carrier structure 900, sometimes called a first layer transfer template, is complete.

Upper circuit pattern carrier structure 900 includes carrier 204, seed layer 202, and an upper, e.g., second, circuit pattern 1234 formed by conductor layer 1116. Upper circuit pattern 1234 remains upon seed layer 202 and generally on carrier 204. Upper circuit pattern 1234 includes traces, landing pads and/or other electrically conductive features.

Upper circuit pattern 1234 has thickness T3. More particularly, thickness T3 is measured in the vertical direction substantially perpendicular to first surface 204U of carrier 204.

Figure 13:
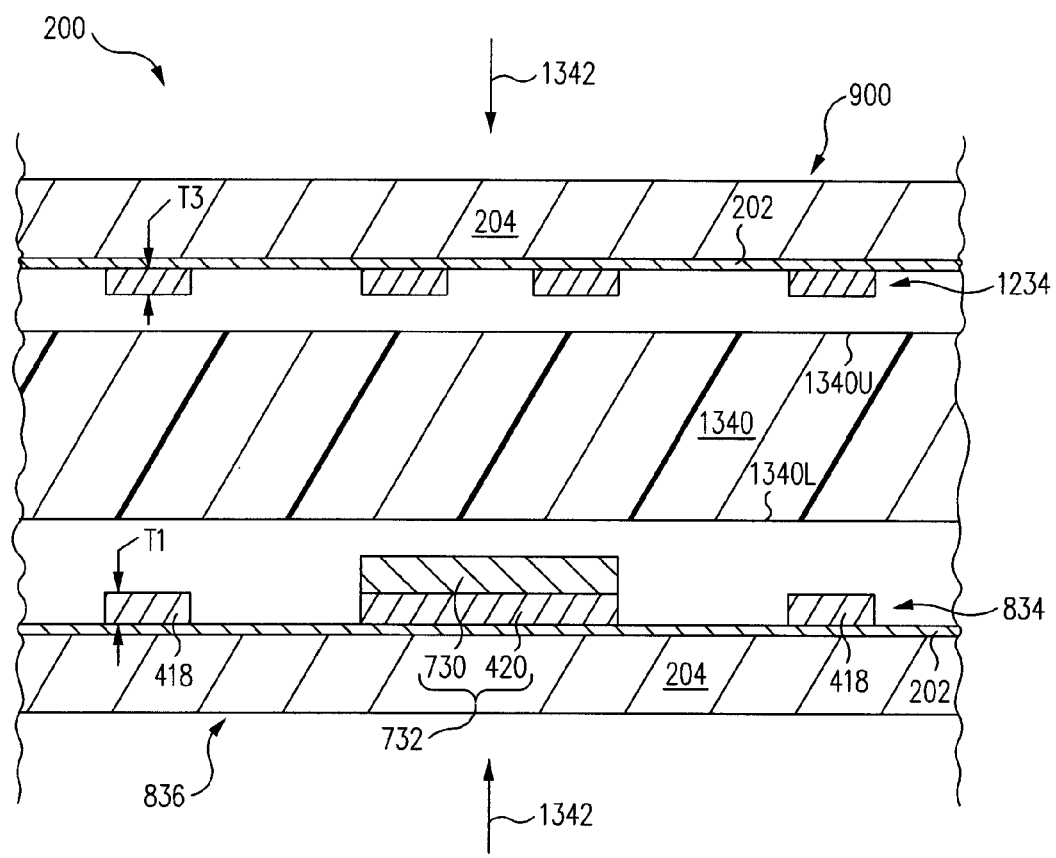
FIG. 13 is a cross-sectional view of the extended landing pad substrate package of FIGS. 8, 12 at a later stage during fabrication in accordance with one embodiment.
Figure 14:
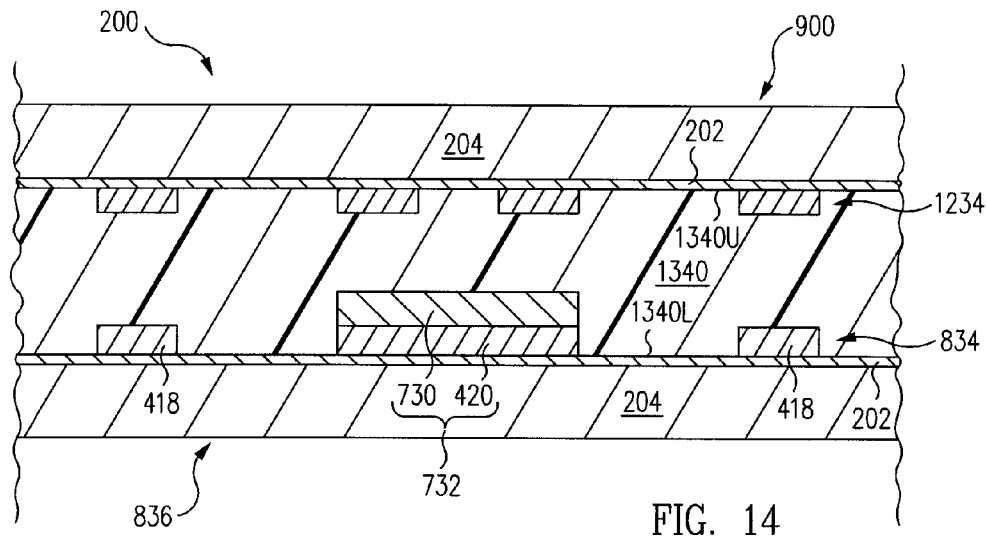
FIGS. 14, 15, 16, 17 are cross-sectional views of the extended landing pad substrate package of FIG. 13 at later stages during fabrication in accordance with various embodiments.

FIG. 13 is a cross-sectional view of extended landing pad substrate package 200 of FIGS. 8, 12 at a later stage during fabrication in accordance with one embodiment. FIG. 14 is a cross-sectional view of extended landing pad substrate package 200 of FIG. 13 at a later stage during fabrication in accordance with one embodiment.

Referring now to FIGS. 1, 13 and 14 together, from strip primary resist and second resist operation 116 and strip resist operation 126, flow moves to a laminate upper and lower circuit patterns to dielectric layer operation 128. In laminate upper and lower circuit patterns to dielectric layer operation 128, upper circuit pattern 1234 and lower circuit pattern 834 are laminated to a dielectric layer 1340.

Dielectric layer 1340 includes an upper, e.g., first, surface 1340U and an opposite lower, e.g., second, surface 1340L. Upper circuit pattern 1234 of upper circuit pattern carrier structure 900 (which has been inverted from the view of FIG. 12) is laminated into upper surface 1340U of dielectric layer 1340. Similarly, lower circuit pattern 834 of lower circuit pattern carrier structure 836 is laminated into lower surface 1340L of dielectric layer 1340.

In one embodiment, upper circuit pattern carrier structure 900 and lower circuit pattern carrier structure 836 are simultaneously pressed into dielectric layer 1340 as indicated by the arrows 1342 in FIG. 13 while the assembly is heated. This causes dielectric layer 1340 to flow around upper circuit pattern 1234 and lower circuit pattern 834 and to seed layers 202. Accordingly, upper circuit pattern 1234 is embedded within upper surface 1340U of dielectric layer 1340 and lower circuit pattern 834 is embedded within lower surface 1340L of dielectric layer 1340 as illustrated in FIG. 14.

In accordance with one embodiment, thickness T3 of upper circuit pattern 1234 is approximately equal to thickness T1 of traces 418. However, in other embodiments, thickness T3 of upper circuit pattern 1234 is greater than or less than thickness T1 of traces 418.

FIG. 15 is a cross-sectional view of extended landing pad substrate package 200 of FIG. 14 at a later stage during fabrication in accordance with one embodiment. Referring now to FIGS. 1, 14 and 15 together, from laminate upper and lower circuit patterns to dielectric layer operation 128, flow moves to a remove carriers operation 130. In remove carriers operation 130, carriers 204 of circuit pattern carrier structures 900, 836 are removed. Illustratively, carriers 204 are removed by etching, mechanical grinding, and/or peeling.

From remove carriers operation 130, flow moves to a remove seed layers operation 132. In remove seed layers operation 132, seed layers 202 of circuit pattern carrier structures 900, 836 are removed. Illustratively, seed layers 202 are removed by etching and/or mechanical grinding.

As illustrated in FIG. 15, after removal of seed layers 202, upper surface 1340U, upper circuit pattern 1234, lower surface 1340L, and lower circuit pattern 834 are exposed.

From remove seed layers operation 132, flow moves to a form blind via apertures operation 134. In form blind via apertures operation 134, blind via apertures 1544 are formed, e.g., using laser-ablation. Blind via apertures 1544 extend through upper circuit pattern 1234 and dielectric layer 1340 and to extended landing pads 732 of lower circuit pattern 834. Blind via apertures 1544 expose extended landing pads 732 but do not extend through extended landing pads 732.

As extended landing pads 732 have an increased thickness T2 as compared to thickness T1 of traces 418 of lower circuit pattern 834, the length L1 of blind via apertures 1544 is minimized. Length L1, sometimes called a first distance, is the distance between extended landing pads 732 and upper surface 1340U of dielectric layer 1340. In contrast, a length L2 greater than length L1 exists between traces 418 and upper surface 1340U of dielectric layer 1340. More particularly, length L2, sometimes called a second distance, is the distance between traces 418 and upper surface 1340U of dielectric layer 1340.

Further, blind via apertures 1544 have a first width W3 at upper surface 1340U of dielectric layer 1340 and a second width W4 at extended landing pads 732. As illustrated, blind via apertures 1544 taper from width W3 at upper surface 1340U of dielectric layer 1340 to width W4 at extended landing pads 732, width W3 being greater than width W4.

As those of skill in the art will understand in light of this disclosure, blind via apertures have an aspect ratio, i.e., a length to width ratio, due to the laser-ablation process used to form the blind via aperture. For example, the aspect ratio of blind via apertures 1544 is length L1 divided by width W3 (L1/W3).

Accordingly, as the length of blind via apertures decreases, the resulting width of the blind via apertures also decreases. As discussed above, the length L1 of blind via apertures 1544 is minimized due to the increased thickness T2 of extended landing pads 732 as compared to thickness T1 of traces 418. Accordingly, the width W3 of blind via apertures 1544 at upper surface 1340U of dielectric layer 1340 is minimized. Accordingly, extremely small blind via apertures 1544 are formed even when dielectric layer 1340 is relatively thick. This enables upper circuit pattern 1234 to be formed with minimum feature size.

In one embodiment, by minimizing length L1 of blind via apertures 1544, tolerance in the alignment between blind via apertures 1544 and extended landing pads 732 is minimized. This enables the width of extended landing pads 732 in a direction parallel to lower surface 1340L of dielectric layer 1340 to be minimized. This, in turn, enables lower circuit pattern 834 to be formed with minimum feature size.

In one embodiment, by minimizing length L1 of blind via apertures 1544, the time required to form blind via apertures 1544 is minimized thus minimizing the cost of the blind via laser-ablation process and thus of extended landing pad substrate package 200.

Figure 16:
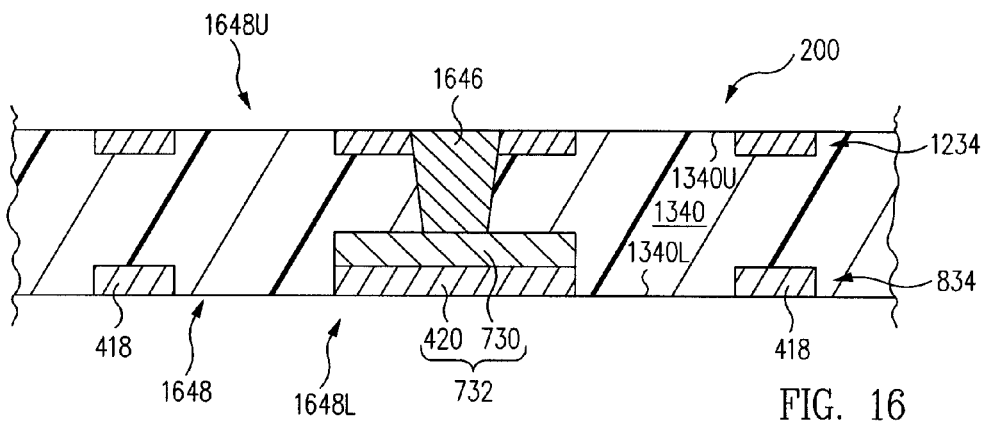

FIG. 16 is a cross-sectional view of extended landing pad substrate package 200 of FIG. 15 at a later stage during fabrication in accordance with one embodiment. Referring now to FIGS. 1, 15 and 16 together, from form blind via apertures operation 134, flow moves to a form blind vias operation 136. In form blind vias operation 136, blind vias 1646 are formed within blind via apertures 1544. More particularly, blind via apertures 1544 are filled with electrically conductive material, e.g., by plating a blind via metal or applying an electrically conductive epoxy, to form blind vias 1646.

Blind vias 1646 extend through upper circuit pattern 1234 and dielectric layer 1340 and to extended landing pads 732 of lower circuit pattern 834. Accordingly, upper circuit pattern 1234 is electrically connected to lower circuit pattern 834 through dielectric layer 1340 by blind vias 1646. Blind vias 1646 are formed within blind via apertures 1544 and thus the above discussion of blind via apertures 1544 and the relative dimensions thereof are equally applicable to blind vias 1646.

Extended landing pad substrate package 200 at the stage illustrated in FIG. 16 is sometimes referred to as an extended landing pad substrate 1648. Extended landing pad substrate 1648 includes dielectric layer 1340, upper circuit pattern 1234 embedded within upper surface 1340U of dielectric layer 1340, lower circuit pattern 834 embedded within lower surface 1340L of dielectric layer 1340, and blind vias 1646 electrically connecting upper and lower circuit patterns 1234, 834 through dielectric layer 1340. Extending landing pad substrate 1648 includes an upper, e.g., first surface 1648U and an opposite lower, e.g., second, surface 1648L.

Figure 17:
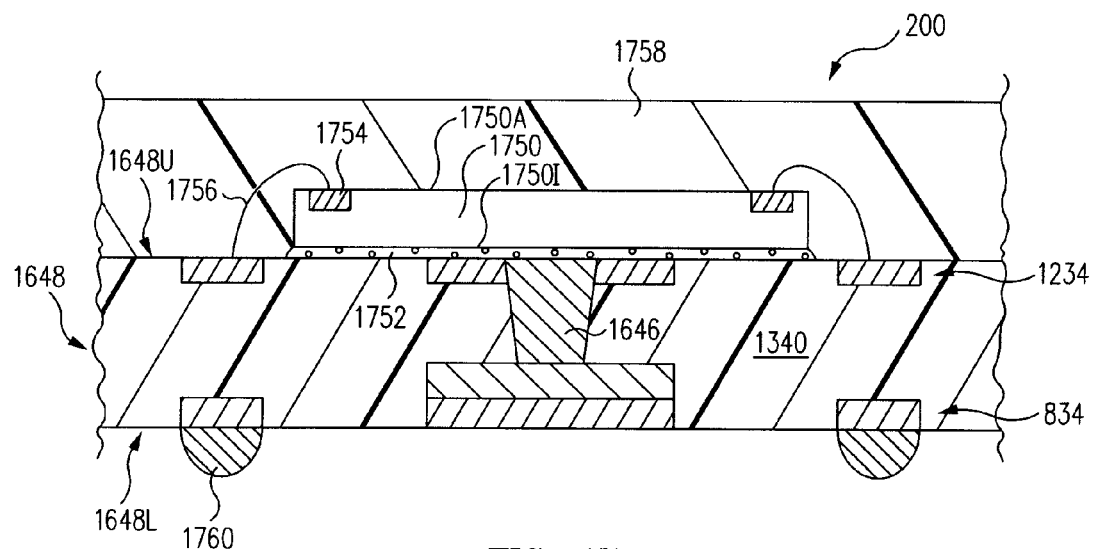

FIG. 17 is a cross-sectional view of extended landing pad substrate package 200 of FIG. 16 at a later stage during fabrication in accordance with one embodiment. Referring now to FIGS. 1 and 17 together, from form blind vias operation 136, flow moves to a mount electronic component(s) operation 138. In mount electronic component(s) operation 138, at least one electronic component 1750 is mounted to extended landing pad substrate 1648.

Electronic component 1750 is an integrated circuit chip, i.e., an active component, in accordance with this embodiment. However, in other embodiments, electronic component 1750 is a passive component, e.g., a capacitor, resistor or inductor.

In the embodiment illustrated in FIG. 17, electronic component 1750 is mounted in a wire bond configuration. More particularly, electronic component 1750 includes an inactive surface 1750I mounted to upper surface 1648U of extended landing pad substrate 1648 with an adhesive 1752, sometimes called a die attach adhesive. Bond pads 1754 on an active surface 1750A of electronic component 1750 are electrically connected to upper circuit pattern 1234 by bond wires 1756. Optionally, a package body 1758, e.g., an encapsulant, molding compound, or other dielectric material, is formed to encapsulate and protect electronic component 1750 and bond wires 1756.

From mount electronic component(s) operation 138, flow moves, optionally, to a form interconnection balls operation 140. In form interconnection balls operation 140, interconnection balls 1760, e.g., solder balls, are formed on lower circuit pattern 834. Interconnection balls 1760, e.g., a ball grid array, are used to electrically interconnect and mount extended landing pad substrate package 200 to a larger substrate such as a printed circuit motherboard. However, in another embodiment, interconnection balls 1760 are not formed and thus form interconnection balls operation 140 is an optional operation.

Figure 18:
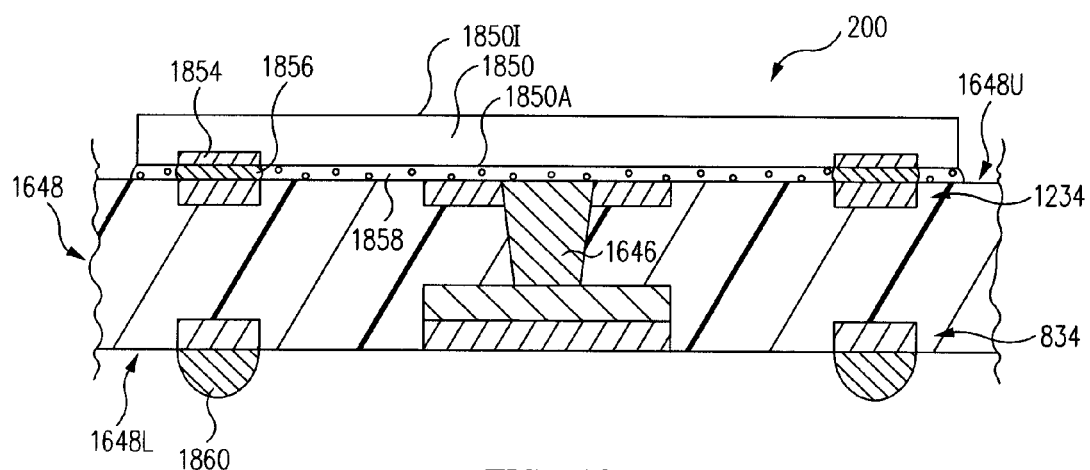
FIG. 18 is a cross-sectional view of the extended landing pad substrate package of FIG. 16 at a later stage during fabrication in accordance with another embodiment.

FIG. 18 is a cross-sectional view of extended landing pad substrate package 200 of FIG. 16 at a later stage during fabrication in accordance with another embodiment. Referring now to FIGS. 1 and 18 together, from form blind vias operation 136, flow moves to mount electronic component(s) operation 138. In mount electronic component(s) operation 138, at least one electronic component 1850 is mounted to extended landing pad substrate 1648.

Electronic component 1850 is an integrated circuit chip, i.e., an active component, in accordance with this embodiment. However, in other embodiments, electronic component 1850 is a passive component, e.g., a capacitor, resistor or inductor.

In the embodiment illustrated in FIG. 18, electronic component 1850 is mounted in a flip chip configuration. More particularly, electronic component 1850 includes an inactive surface 1850I and an opposite active surface 1850A. Bond pads 1854 on active surface 1850A of electronic component 1850 are physically and electrically connected to upper circuit pattern 1234 by flip chip bumps 1856, e.g., solder bumps. Optionally, an underfill material 1858 is formed between upper surface 1648U of extended landing pad substrate 1648 and active surface 1850A of electronic component 1850 to encapsulate and protect flip chip bumps 1856.

From mount electronic component(s) operation 138, flow moves, optionally, to form interconnection balls operation 140. In form interconnection balls operation 140, interconnection balls 1860, e.g., solder balls, are formed on lower circuit pattern 834. Interconnection balls 1860, e.g., a ball grid array, are used to electrically interconnect and mount extended landing pad substrate package 200 to a larger substrate such as a printed circuit motherboard. However, in another embodiment, interconnection balls 1860 are not formed and thus form interconnection balls operation 140 is an optional operation.

Although formation of an individual extended landing pad substrate package 200 is described above, in other embodiments, a plurality of extended landing pad substrate package 200 are formed simultaneously in an array or strip using extended landing pad substrate package formation method 100 as described above. The array or strip is singulated to singulate extended landing pad substrate packages 200 from one another.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. An extended landing pad substrate package comprising:
   a dielectric layer having a first surface and an opposite second surface;
   a first circuit pattern embedded in the second surface of the dielectric layer, the first circuit pattern comprising traces and extended landing pads:
   the traces having a first thickness and
   the extended landing pads having a second thickness greater than the first thickness;
   a second circuit pattern completely in the dielectric layer and embedded in the first surface of the dielectric layer, wherein only the dielectric layer remains vertically between the traces of the first circuit pattern and the second circuit pattern;
   blind vias electrically connecting the first circuit pattern and the second circuit pattern, wherein the blind vias extend through the second circuit pattern, through the dielectric layer, and to the extended landing pads of the first circuit pattern; and
   interconnection balls in direct contact with the first circuit pattern.

2. The extended landing pad substrate package of claim 1 wherein the extended landing pads comprise:
   extended landing pad foundation portions; and
   extended landing pad extension portions.

3. The extended landing pad substrate package of claim 2 wherein the extended landing pad foundation portions have the first thickness.

4. The extended landing pad substrate package of claim 1 wherein a first distance between the extended landing pads and the first surface of the dielectric layer is less than a second distance between the traces and the first surface of the dielectric layer.

5. The extended landing pad substrate package of claim 1 wherein the second circuit pattern has the first thickness.

6. The extended landing pad substrate package of claim 1 wherein the blind vias have a first width at the first surface of the dielectric layer and a second width at the extended landing pads.

7. The extended landing pad substrate package of claim 6 wherein the first width is greater than the second width.

8. The extended landing pad substrate package of claim 1 wherein the blind vias are formed within blind via apertures.

9. The extended landing pad substrate package of claim 1 further comprising an electronic component electrically coupled to the second circuit pattern.

10. An extended landing pad substrate package comprising:

a dielectric layer having a first surface and an opposite second surface;

a first circuit pattern embedded in the second surface of the dielectric layer, the first circuit pattern comprising traces and extended landing pads:

the traces having a first thickness; and the extended landing pads comprising extended landing pad foundation portions and extended landing pad extension portions the extended landing pad foundation portions having the first thickness comprising a primary conductor layer and the extended landing pad extension portions comprising a secondary conductor layer selectively plated on the entire extended landing pad foundation portions such that sides of the extended landing pad foundation portions are directly aligned with sides of the extended landing pad extension portions;

a second circuit pattern completely in the dielectric layer and embedded in the first surface of the dielectric layer, wherein only the dielectric layer remains vertically between the traces of the first circuit pattern and the second circuit pattern;

blind vias electrically connecting the first circuit pattern and the second circuit pattern, wherein the blind vias extend through the second circuit pattern, through the dielectric layer, and to the extended landing pads of the first circuit pattern; and interconnection balls in direct contact with the first circuit pattern.

11. An extended landing pad substrate package comprising:

a dielectric layer;

a first circuit pattern laminated into the dielectric layer, the first circuit pattern comprising a primary conductor layer;

the primary conductor layer comprising traces, extended landing pad foundation portions and extended landing pad extension portions the traces having a first thickness;

the extended landing pad foundation portions having the first thickness; and the extended landing pad extension portions comprising a secondary conductor layer selectively plated on the entire extended landing pad foundation portions such that sides of the extended landing pad foundation portions are directly aligned with sides of the extended landing pad extension portions, the extended landing pad extension portions and the extended landing pad foundation portions forming extended landing pads having a second thickness greater than the first thickness;

blind via apertures extending through the dielectric layer and to the extended landing pads;

a second circuit pattern laminated and completely in the dielectric layer and embedded into a first surface of the dielectric layer, wherein the first circuit pattern is laminated into a second surface of the dielectric layer, wherein the blind via apertures extend from the first surface of the dielectric layer, through the second circuit pattern, through the dielectric layer, and to the extended landing pads, wherein only the dielectric layer remains vertically between the traces of the first circuit pattern and the second circuit pattern; and interconnection balls in direct contact with the first circuit pattern.

12. The extended landing pad substrate package of claim 11 further comprising blind vias in the blind via apertures.

13. The extended landing pad substrate package of claim 12 wherein the blind vias electrically connect the first circuit pattern and the second circuit pattern.

14. The extended landing pad substrate package of claim 11 further comprising:

an electronic component electrically coupled to the second circuit pattern.

\* \* \* \* \*